(12) United States Patent
Yang et al.

(10) Patent No.: US 11,579,969 B2
(45) Date of Patent: Feb. 14, 2023

(54) VERIFYING METHOD FOR ECC CIRCUIT OF SRAM

(71) Applicant: REALTEK SEMICONDUCTOR CORP., Hsinchu (TW)

(72) Inventors: Zhi-Qiang Yang, Hsinchu (TW); Jia-Jia Cai, Hsinchu (TW); Bin Chen, Hsinchu (TW); Dong Qiu, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/336,818

(22) Filed: Jun. 2, 2021

(65) Prior Publication Data
US 2022/0283897 A1    Sep. 8, 2022

(30) Foreign Application Priority Data
Mar. 4, 2021 (CN) .......................... 202110241055.1

(51) Int. Cl.
*G06F 11/00* (2006.01)
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 5,875,195 A | * | 2/1999 | Dixon | G06F 11/261 714/719 |
| 6,519,718 B1 | * | 2/2003 | Graham | G06F 11/221 714/41 |
| 6,983,414 B1 | * | 1/2006 | Duschatko | H04L 1/0057 714/776 |

(Continued)

FOREIGN PATENT DOCUMENTS

| | | |
|---|---|---|
| CN | 107430540 A | 12/2017 |
| CN | 111104246 A | 5/2020 |

OTHER PUBLICATIONS

Y. Zhang et al., "Design and Verification of SRAM Self-Detection Repair Based on ECC and BISR Circuit," 2019 IEEE 26th International Symposium on Physical and Failure Analysis of Integrated Circuits (IPFA), 2019, pp. 1-5, doi: 10.1109/IPFA47161.2019.8984845. (Year: 2019).*

(Continued)

*Primary Examiner* — Daniel F. McMahon
(74) *Attorney, Agent, or Firm* — Birch, Stewart, Kolasch & Birch, LLP

(57) ABSTRACT

A verifying method for an error checking and correcting (ECC) circuit of a static random-access memory (SRAM) is provided. The SRAM comprises a storage unit, an ECC circuit and a checking circuit. The ECC circuit receives an original data and an output first data. The checking circuit obtains a second data according to an error-injecting mask. The checking circuit performs a bit operation on the first data and the second data to obtain a third data. The checking circuit writes the third data into a test target area of the storage unit and the written data as a fourth data. The checking circuit reads the fourth data from the test target area. The ECC circuit obtains a fifth data and an error message according to the fourth data. The checking circuit obtains the bit error detection result according to the error message and the second data.

14 Claims, 12 Drawing Sheets

(56) References Cited

U.S. PATENT DOCUMENTS

| | | | | |
|---|---|---|---|---|
| 7,225,390 B2* | 5/2007 | Ito | ................... | G11C 11/40615 714/E11.042 |
| 2004/0249552 A1* | 12/2004 | Di Cola | ................ | F02D 41/009 701/115 |
| 2007/0208977 A1* | 9/2007 | Clark | ............. | G01R 31/318569 714/728 |
| 2008/0052603 A1* | 2/2008 | Wiatrowski | .......... | H04L 1/0041 714/776 |
| 2009/0210772 A1* | 8/2009 | Noguchi | ............ | G11C 16/3427 714/764 |
| 2010/0005366 A1* | 1/2010 | Dell | ....................... | G11C 29/70 714/764 |
| 2011/0320872 A1* | 12/2011 | Bair | .................... | G06F 11/1008 714/E11.178 |
| 2013/0275810 A1* | 10/2013 | Yigzaw | ............... | G06F 11/3688 714/32 |
| 2015/0074473 A1* | 3/2015 | Unesaki | .............. | G06F 11/2215 714/703 |
| 2015/0278077 A1* | 10/2015 | Dawson | .................... | G06F 9/50 717/130 |
| 2016/0343453 A1* | 11/2016 | Yigzaw | ................. | G11C 29/44 |

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017, doi: 10.1109/JPROC.2017. 2713127. (Year: 2017).*

* cited by examiner

| The checking circuit randomly selects the other bits in the error-inserting mask that have not been selected to obtain the at least one new error-inserting bit | — S521 |

↓

| Repeat the random selection of the error-inserting bit, until all of specific positions in the error-inserting mask have been selected as the error-inserting bit for at least one time | — S522 |

VERIFYING METHOD FOR ECC CIRCUIT OF SRAM

CROSS-REFERENCE TO RELATED APPLICATION

This non-provisional application claims priority under 35 U.S.C. § 119(a) to Patent Application No. 202110241055.1 filed in China, P.R.C. on Mar. 4, 2021, the entire contents of which are hereby incorporated by reference.

BACKGROUND

Technical Field

The present invention relates to a processing method for verifying data and an electronic device therefor, and in particular, to a verifying method for an error checking and correcting (ECC) circuit of a static random-access memory (SRAM).

Related Art

With the rapid development of manufacturing processes of integrated circuits, an integrated circuit can accommodate more electronic elements in the same unit area. The SRAM (Static Random-Access Memory) also can accommodate more electronic elements in the same unit area. A high-capacity SRAM can accommodate even more storage elements in a unit area, that is, storage elements are more densely arranged. When a storage element is being written, it is possible that the storage elements adjacent to the storage element being written are susceptible to the electric power or the magnetic force of the writing action, which may produce errors on the data stored in the adjacent storage elements.

Generally, to prevent bit errors in the SRAM, the data can be verified through an ECC mechanism. With an increase in the number of storage elements of the SRAM, a rate of bit errors also increases, so that a normal operation of the ECC mechanism becomes more important.

SUMMARY

In view of the above, according to some embodiments, the present invention provides a verifying method for ECC circuit of SRAM, which is configured to verify where is a bit error in the SRAM and whether the ECC circuit operates correctly.

In some embodiments, the Verifying method for ECC circuit of SRAM includes the following steps: inputting original data into an error-correcting-and-coding procedure to output first data; inputting original data into an error-correcting-and-coding procedure to output the first data; obtaining second data according to an error-injecting mask; performing a bit operation on the first data and the second data to obtain third data; writing the third data into a test target area in the SRAM as fourth data; reading the fourth data from the test target area; inputting the fourth data into an error-correcting-and-decoding procedure to output fifth data and an error message; and obtaining a verification result according to the fifth data, the original data, the error message, and the second data. Through this embodiment, a specific area or all areas in the SRAM may be specified for bit error check, and it is confirmed whether a correction function of the ECC circuit operates normally.

In some embodiments, the step of inputting the original data into the error-correcting-and-coding procedure to output the first data includes: adjusting the original data having an original bit length to the first data having an operation bit length.

In some embodiments, the step of obtaining the second data according to the error-injecting mask includes: setting a bit length of the error-injecting mask according to the operation bit length; selecting at least one error-injecting bit from the error-injecting mask; and writing error-injecting data into the at least one error-injecting bit to obtain the second data.

In some embodiments, the step of obtaining the second data according to the error-injecting mask includes: repeatedly selecting other bits from the error-injecting mask as the at least one error-injecting bit, until all of specific bits of the error-injecting mask have been selected.

In some embodiments, the step of repeatedly selecting the other bits from the error-injecting mask as the at least one error-injecting bit includes: randomly selecting the other bits in the error-injecting mask that have not been selected to obtain at least one new error-injecting bit.

In some embodiments, the step of writing the third data into the test target area in the SRAM as the fourth data includes: selecting an address section from the test target area, where a bit length of the address section is identical to the bit length of the third data; and writing the third data into the address section to be the fourth data.

In some embodiments, the step of writing the third data into the test target area in the SRAM to be the fourth data includes: obtaining a start address and an end address of the SRAM; and defining a space from the start address to the end address to be the test target area, where a bit length of the test target area is greater than or equal to a bit length of the third data.

In some embodiments, the step of writing the third data into the test target area in the SRAM to be the fourth data includes: selecting an address section from the test target area, where a bit length of the address section is identical to the bit length of the third data; and writing the third data into the address section to be the fourth data.

In some embodiments, the step of writing the third data into the address section to be the fourth data includes: repeatedly selecting another address section at other positions from the test target area, until all of specific addresses of the test target area have been selected.

In some embodiments, the step of repeatedly selecting the another address section at the other addresses from the test target area includes: obtaining the another address section starting from an address section shifted from the address section by an incremental distance.

In some embodiments, the step of repeatedly selecting the another address section at the other addresses from the test target area includes: randomly selecting the other addresses in the test target area that have not been selected to obtain the another address section.

In some embodiments, the bit operation is selected from an OR operation or an exclusive-OR operation.

According to some embodiments, according to the verifying method for an ECC circuit of an SRAM, bit error checking may be performed on a specified area or all of the areas, and it may also be confirmed whether the error correcting process of the ECC circuit operates correctly. In some embodiments, checking to the bits can be performed synchronously or in batches according to the verifying method. Compared with the conventional time-sharing check, the method can save checking time and save hardware costs hardware.

DETAILED DESCRIPTION

Figure 1:
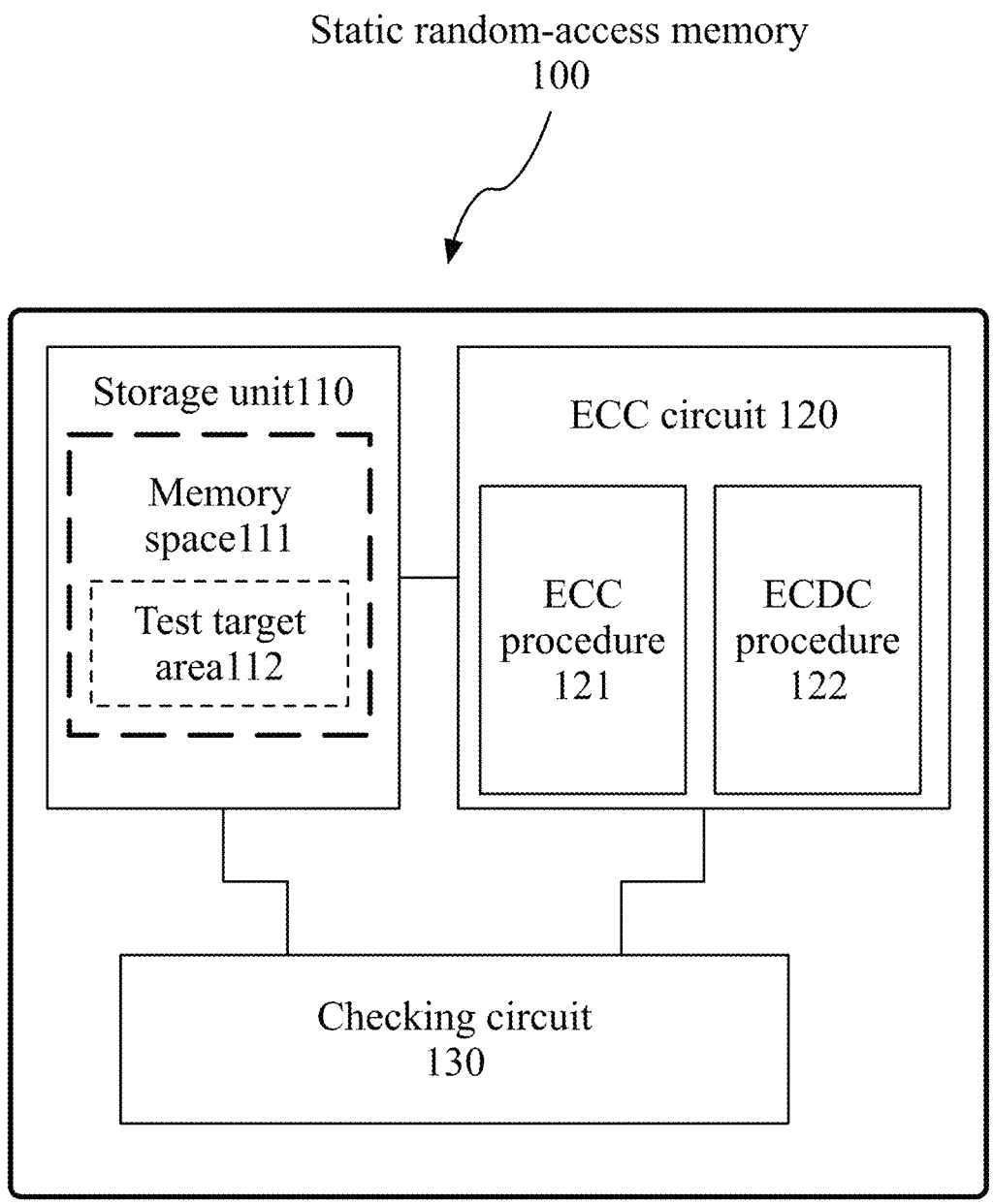
FIG. 1 is a schematic diagram of a system architecture according to an embodiment of the present invention.

FIG. 1 is a schematic diagram of a system architecture according to an embodiment of the present invention. The SRAM 100 of this embodiment includes a storage unit 110, an error checking and correcting circuit 120 (hereinafter referred to as an ECC circuit 120), and a checking circuit 130. The SRAM 100 (or the storage unit 110) can be verified by an external device as well as the SRAM 100 itself. The storage unit 110 is a general collective term of a single memory chip or a plurality of memory chips. A storage space of the storage unit 110 is determined by a number of memory chips. The storage unit 110 has a memory space 111. The memory space 111 includes a test target area 112, and the test target area 112 is configured to check whether there is a bit error in the storage unit 110 in which the test target area is located. A method for selecting the test target area 112 is to be described later.

The ECC circuit 120 is coupled to the storage unit 110. The ECC circuit 120 is configured to receive original data and output first data. Generally, an ECC algorithm may be roughly divided into ECC algorithms for a block code and for a convolution code. The ECC algorithm of the block code includes algorithms for a Gray code, a Bose-Chaudhuri-Hocquenghem (BCH) code, a multidimensional parity-check code, a Hamming code, and the like, but the present invention is not limited thereto. The convolution algorithm code includes a Viterbi algorithm. The ECC circuit 120 can use the ECC algorithm for the block code or the convolution code. The ECC circuit 120 may be configured to execute an error-correcting-and-coding procedure (hereinafter referred to "ECC procedure") and an error-correcting-and-decoding procedure (hereinafter referred to "ECDC procedure"). In addition to the above ECC algorithms, the ECC procedure and the ECDC procedure can also use other algorithms capable of checking and correcting errors. The ECC procedure 121 and the ECDC procedure 122 generally use the same ECC algorithm.

Figure 2A:
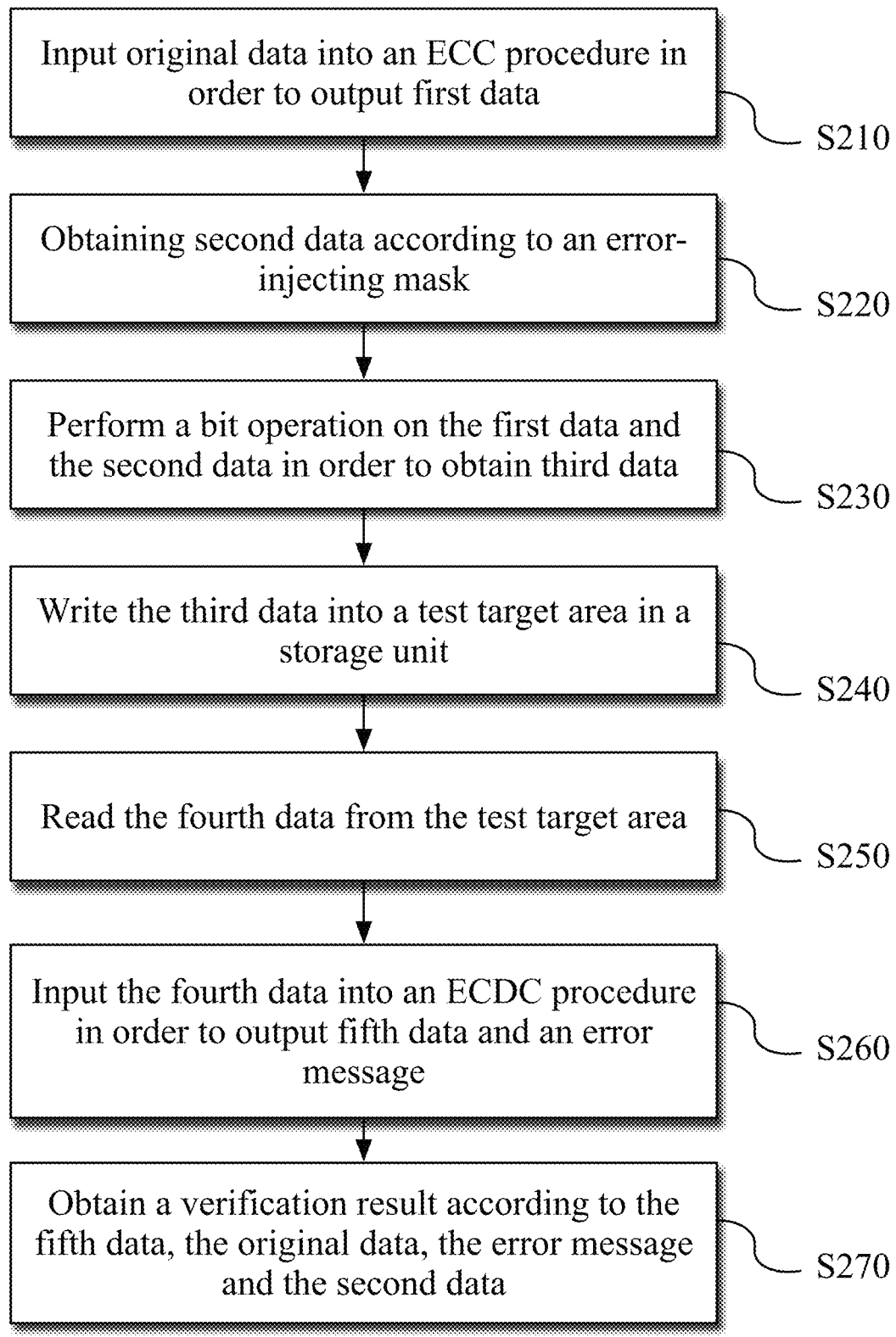
FIG. 2A is a schematic flowchart of a verifying method for an ECC circuit of an SRAM according to an embodiment.
Figure 2B:
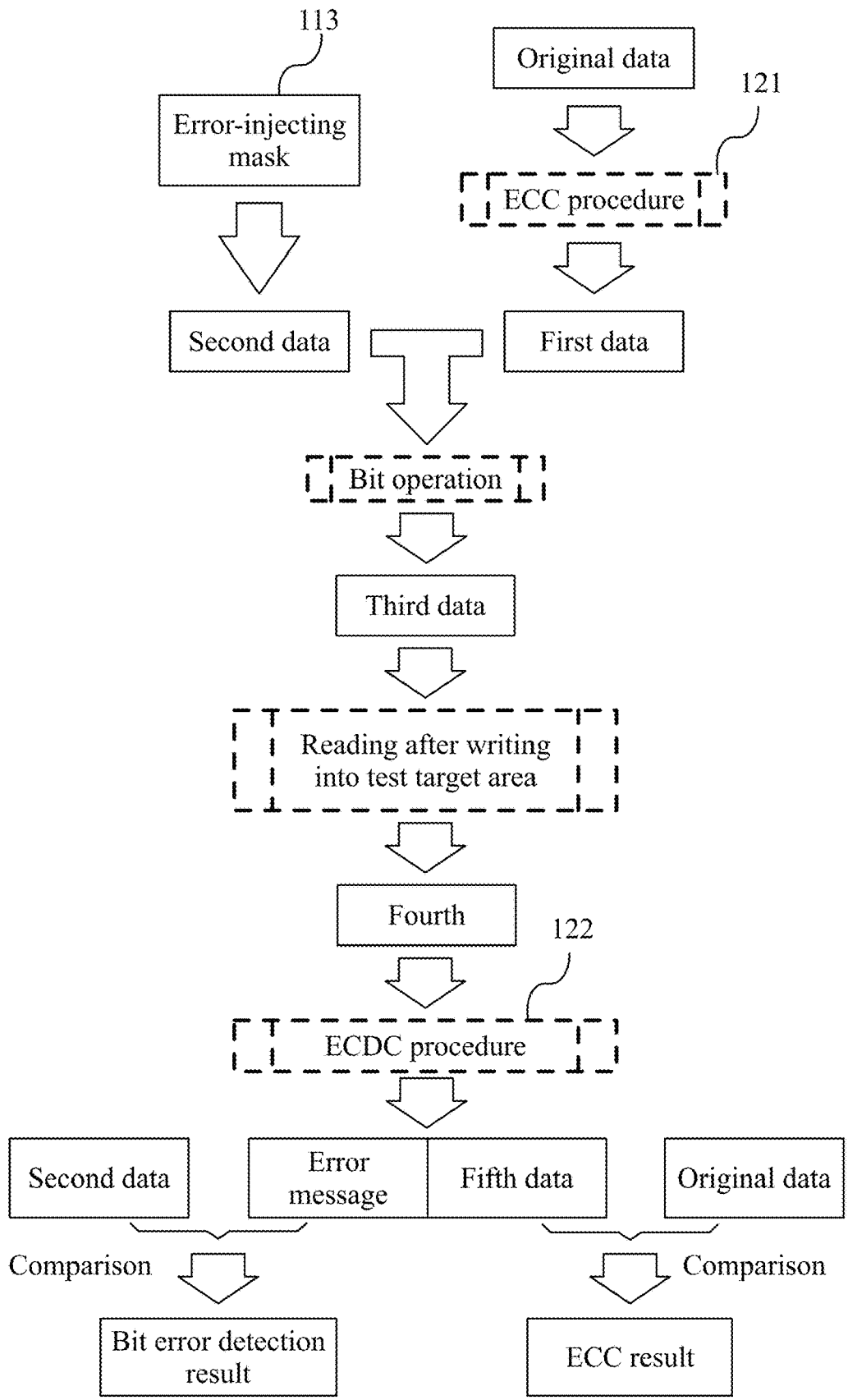
FIG. 2B is a schematic diagram of generating all data according to an embodiment.

The checking circuit 130 is coupled to the storage unit 110 and the ECC circuit 120. When the SRAM 100 is in a test mode, the checking circuit 130 may verify a bit error of the storage unit 110 and verify an operation of the ECC circuit 120. The checking circuit 130 can perform related verification on the storage unit 110 and the ECC circuit 120 according to the original data. FIG. 2A is a schematic flowchart of a verifying method for an ECC circuit of an SRAM according to an embodiment, and FIG. 2B is a schematic diagram of generating all data in the process of the verifying method. The process of the verifying method for an ECC circuit of an SRAM includes the following steps:

Step S210: original data is inputted into an ECC procedure in order to output first data;

Step S220: second data is obtained according to an error-injecting mask;

Step S230: a bit operation on the first data and the second data is performed in order to obtain third data;

Step S240: the third data is written into a test target area in a storage unit to be fourth data;

Step S250: the fourth data is read from the test target area;

Step S260: the fourth data is inputted into an ECDC procedure in order to output fifth data and an error message; and Step S270: a verification result is obtained according to the fifth data, the original data, the error message and the second data.

First, the checking circuit 130 determines whether the SRAM 100 is in the test mode. If the SRAM 100 is in the test mode, the checking circuit 130 generates original data. The checking circuit 130 may generate a set of original data by means of random algorithms. A type of the random algorithms may be, but is not limited to, a Monte Carlo method, a linear congruential generator (LCG) method, a middle-square method, or the like. Generally, a bit length of the original data may not be limited, but may be at least more than two bits. The checking circuit 130 transmits the original data to the ECC circuit 120, so that the ECC circuit 120 can input the original data into the ECC procedure 121 to output the first data, as shown in FIG. 2B.

A bit length of the first data is an operation bit length. Generally, the operation bit length may be equal to the original bit length of the original data. However, in some embodiments, the ECC circuit 120 can adjust the length of the original data according to requirements of the ECC procedure 121. The ECC procedure 121 adjusts the original bit length of the original data to the operation bit length of the first data. In FIG. 2B, dashed text boxes represent actions/programs to be executed after a target object is inputted.

For example, the original bit length of the original data may be 8 bits, which is "1010 1010". After the original data is inputted into the ECC procedure 121, the ECC procedure 121 can output the first data "01011 1010 1010" with a length of 13 bits (i.e., the operation bit length).

Figure 3:
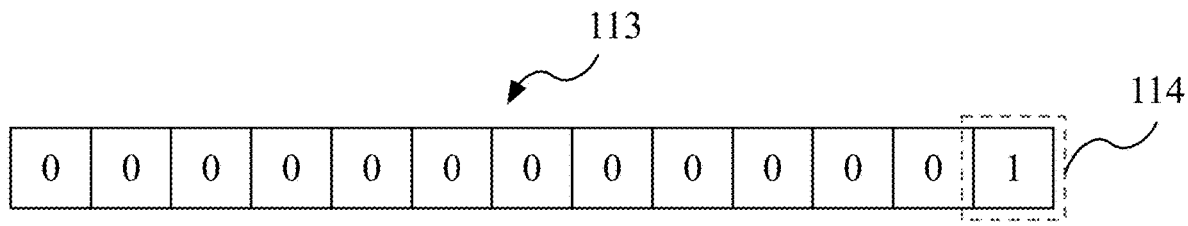
FIG. 3 is a schematic diagram of an error-injecting mask and an error-injecting bit according to an embodiment.

Then, the checking circuit 130 obtains second data according to an error-injecting mask 113. A length of the error-injecting mask 113 corresponds to the operation bit length, as shown in FIG. 3. The operation bit length described in the previous paragraph is given by way of example. The error-injecting mask 113 corresponds to a length of 13 bits. The error-injecting mask 113 shown in FIG. 3 is formed by zeros and ones, where a zero ("0") represents a bit address into which no data is written, and a one ("1") represents a bit address into which data can be written, which may be also referred to as an error-injecting bit 114. A number of error-injecting bits 114 is greater than or equal to one. In FIG. 3, the error-injecting bit 114 is marked with a gray dashed box. The checking circuit 130 may perform a bit operation on any data and the error-injecting mask 113 to obtain the second data. Alternatively, the checking circuit 130 may directly use the corrected error-injecting mask 113 as the second data after writing a piece of error-injecting data into the error-injecting bit 114. Alternatively, a plurality of pieces of error-injecting data can be respectively written into the corresponding error-injecting bit, so that the corrected error-injecting mask 113 is used as the second data. In this case, the checking circuit 130 additionally records a position of the error-injecting bit 114 in the second data.

Generally, the error-injecting mask 113 may include at least one error-injecting bit 114, and a plurality of error-injecting bits 114 may not necessarily be adjacent to each other. In this embodiment, a single-round check of the ECC circuit 120 is used for description. In other embodiments, in different checking rounds, a position of the error-injecting bit 114 can be adjusted, and operating methods of a plurality of rounds are to be described later.

The checking circuit 130 performs a bit operation on the first data and the second data to obtain third data. In some embodiments, the bit operation may be an exclusive-OR (XOR for short) operation. According to the previous example, if the first data is "01011 1010 1010" and the second data is "00000 0000 0001", the third data obtained by performing the XOR operation on the first data and the second data by the checking circuit 130 may be "01011 1010 1011". The checking circuit 130 writes the third data into the test target area 112 of the storage unit 110. In order to distinguish between data before and after being written into the test target area 112, the third data is referred to as fourth data after being written into the test target area 112, as shown in FIG. 2B.

The checking circuit 130 reads the fourth data from the test target area 112. The checking circuit 130 drives the ECC circuit 120 to perform an ECDC procedure 122 on the fourth data to output fifth data and an error message. The error message may include "a single bit error" and "a multi-bit error". The checking circuit 130 obtains a verification result according to the fifth data, the original data, the error message, and the second data. In addition to including whether the ECC circuit 120 operates normally, the verification result may further include an ECC result and a bit error detection result. The checking circuit 130 can obtain the ECC result according to the fifth data and the original data. The checking circuit 130 obtains the bit error detection result according to the error message and the second data.

The error-injecting mask 113 in the previous example is "00000 0000 0001", so that the checking circuit 130 writes error-injecting data into the position of the error-injecting bit 114 to generate the second data "00000 0000 0001". If the third data that have been written into the test target area 112 is "01011 1010 1011", the fourth data that may be read from the test target area 112 is also "01011 1010 1011". The ECC circuit 120 performs the ECDC procedure 122 on the fourth data to obtain fifth data "1010 1010" and an error message (e.g., the single bit error or the multi-bit error). In some embodiments, a message of the single bit error and a message of the multi-bit error message may be represented in the following ways. (1) Two independent bits are used for representation. One bit is used to indicate the message of the single bit error, for example, if a value of this bit is 0, it indicates that there is no single bit error, and a value of 1 indicates that there is a single bite error. Another bit is used to indicate a multi-bit error. For example, if a value of this bit is 0, it indicates that there is no multi-bit error, and a value of 1 indicates that there is a multi-bit error. (2) Alternatively, two associated bits are used for representation. For example, if these two bits show 00, it indicates that there is no bit error, 01 indicates that there is a single bit error, and 11 indicates that there is a multi-bit error, but the present invention is not limited thereto.

The checking circuit 130 compares the fifth data with the original data to obtain an ECC result. If the fifth data is the identical to the original data, the ECC result shows "correct", which indicate that a function of the ECC circuit 120 for correcting bits is normal. The checking circuit 130 compares the second data with the error message to obtain a bit error detection result. Since error-injecting mask 113 only includes one piece of error data, the checking circuit 130 can detect at least one error. In this case, if the bit error detection result shows "single element error", it indicates that the function of the ECC circuit 120 for checking error bits is normal. Therefore, the verification result may be recorded as "the ECC circuit 120 operates normally". Moreover, the bits at other positions in the test target area 112 may also be accessed normally.

In addition, if the bit error detection result shows "single element error" and the fifth data is different from the original data, it indicates that the ECC circuit 120 is abnormal. The checking circuit 130 may output a verification result of "the ECC circuit 120 operates abnormally".

If the bit error detection result shows "the multi-bit error", it indicates that the ECC circuit 120 operates abnormally or there are other bit errors being detected in the test target area 112 (however, only one piece of error data is added to the error-injecting mask 113). Therefore, if it shows "multi-bit error" in this case, whether the fifth data is identical the original data or not, the checking circuit 130 outputs the verification result as "the ECC circuit 120 operates abnormally".

Figure 4:
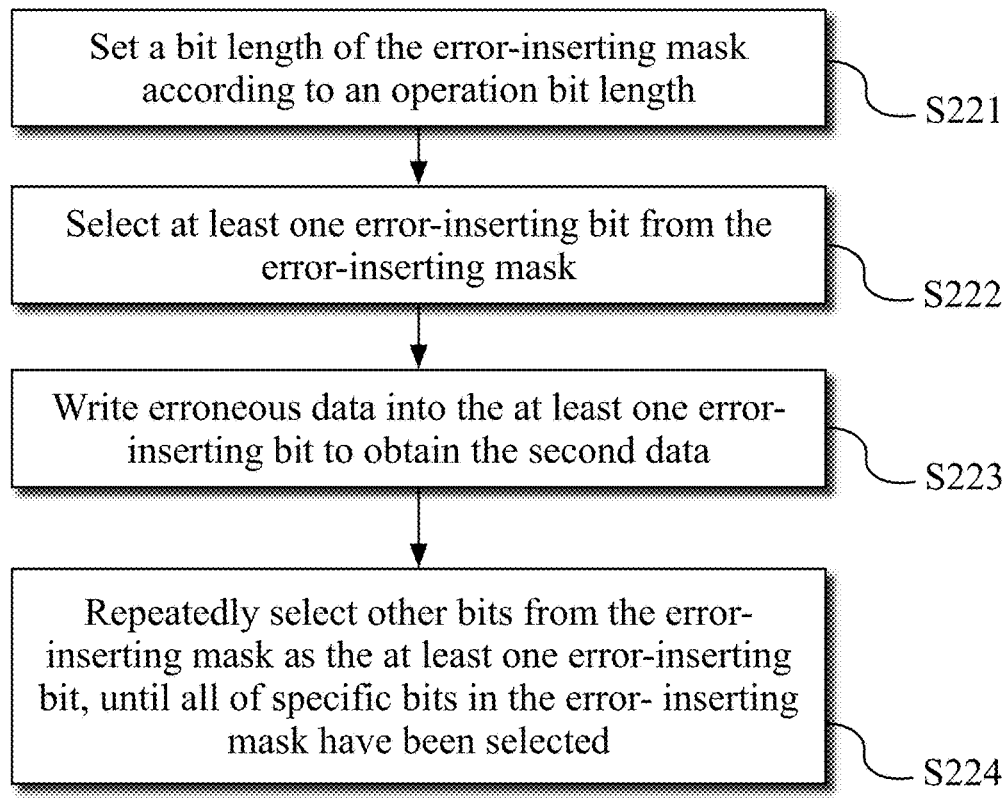
FIG. 4 is a schematic flowchart of obtaining second data according to an embodiment.

In some embodiments, the checking circuit 130 may adjust a position of the error-injecting bit 114 according to the bit length of the error-injecting mask 113 and the setting round. FIG. 4 is a schematic flowchart of obtaining second data according to some embodiments. The process further includes the following steps:

Step S221: a bit length of the error-injecting is set mask according to the operation bit length;

Step S222: at least one error-injecting bit is selected from the error-injecting mask;

Step S223: error-injecting data is written into at least one error-injecting bit to obtain the second data; and Step S224: other bits from the error-injecting mask is selected by turns as the at least one error-injecting bit, until all of specific bits of the error-injecting mask have been selected.

First, the checking circuit 130 determines the bit length of the error-injecting mask 113 according to the operation bit length of the first data, so that the first data has the same bit length as the error-injecting mask 113. In other words, the first data also has the same bit length as the second data. The checking circuit 130 selects the error-injecting bit 114 of at least one bit length from the error-injecting mask 113. Therefore, each time that the error-injecting bit 114 is set is referred to as a setting round. After each setting round, the checking circuit 130 can generate a new set of second data. In other words, the checking circuit 130 can generate a corresponding amount of second data according to a number of setting rounds.

For example, if the error-injecting mask 113 has a length of 13 bits, the checking circuit 130 selects 1 bit as the error-injecting bit 114. Therefore, the checking circuit 130 may perform 13 rounds for setting the error-injecting bit 114 to obtain 13 sets of second data (including the second data in the above embodiment of FIG. 3). The checking circuit 130 generates corresponding third data according to the obtained second data.

Figure 5A:
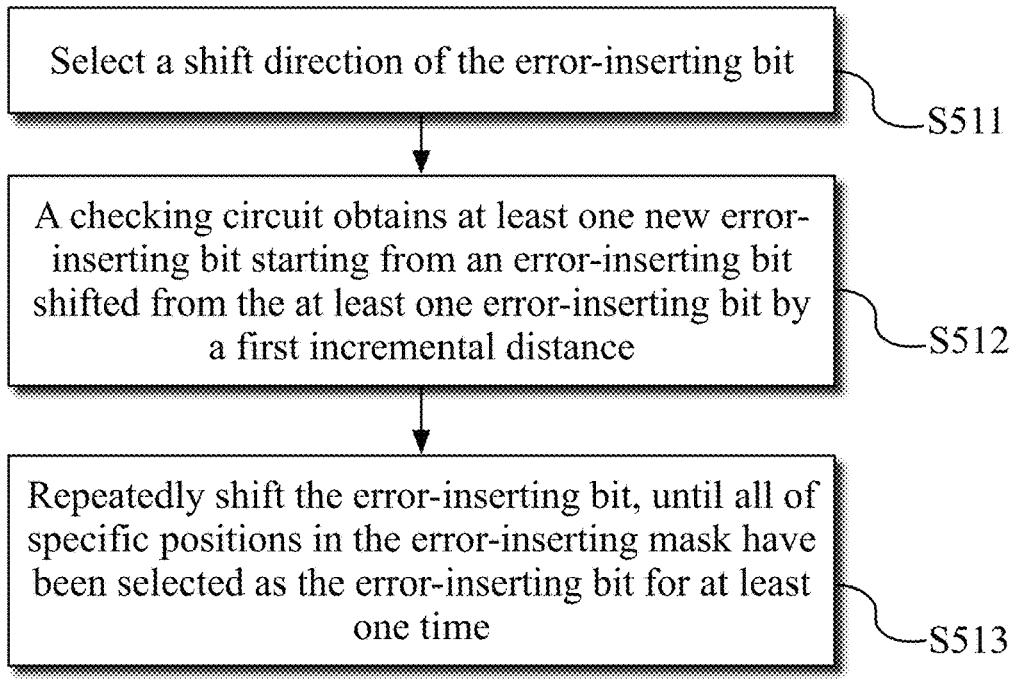
FIG. 5A is a schematic flowchart of an operation of selecting the error-injecting bit according to an embodiment.

In some embodiments, the checking circuit 130 may select the error-injecting bit 114 to obtain the second data in the following manner, as shown in FIG. 5A. FIG. 5A is a schematic diagram of an operation process of selecting an error-injecting bit according to an embodiment. The process includes the following steps:

Step S511: a shift direction of the error-injecting bit is selected;

Step S512: at least one new error-injecting bit is obtained by a checking circuit, wherein the new error-injecting bit is starting from an error-injecting bit shifted from the at least one error-injecting bit by a first incremental distance; and Step S513: the error-injecting bit is shifted repeatedly, until all of specific positions in the error-injecting mask have been selected as the error-injecting bit for at least once.

The checking circuit 130 selects the shift direction of the error-injecting bit 114, and the shift direction may include a left shift or a right shift. When a setting round is ended, the checking circuit 130 may use the current the error-injecting bit 114 as a starting point and shift the current error-injecting bit by the first incremental distance. A bit position obtained after the error-injecting bit is shifted by the first incremental distance is a position of the new error-injecting bit 114. In a next setting round of the checking circuit 130, the checking circuit 130 may perform the above verification by using the new error-injecting bit 114. Basically, the minimum movement distance of the first incremental distance is 1 bit.

Figure 5B:
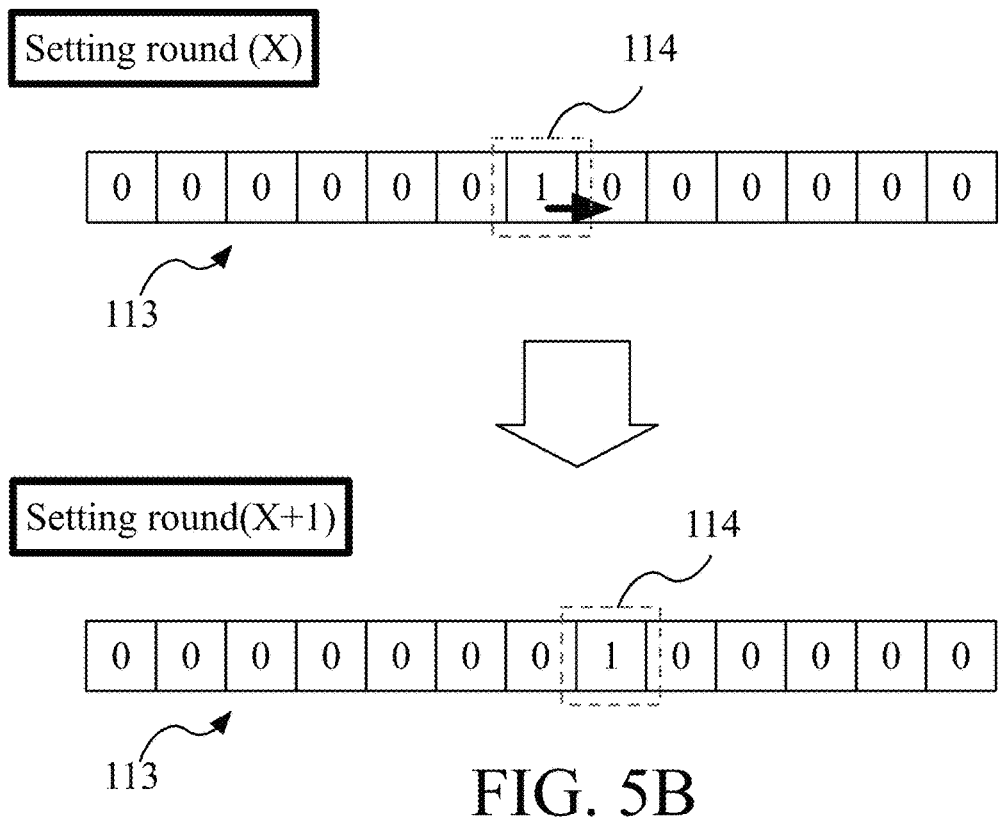
FIG. 5B is a schematic diagram of a single error-injecting bit and shift processing in different setting rounds according to an embodiment.

FIG. 5B is a schematic diagram of a single error-injecting bit and shift processing in different setting rounds according to an embodiment. If a number of error-injecting bits 114 is 1, and the first incremental distance is 1 bit, a shift direction is a right shift (illustrated with a black arrow in the figure). An upper part of FIG. 5B shows positions of the error-injecting mask 113 and the error-injecting bit 114 in a setting round (X), and a lower part of FIG. 5B shows positions of the error-injecting mask 113 and the error-injecting bit 114 in the setting round (X+1), where X represents a number of rounds. When specific positions in the error-injecting mask are all the positions in the error-injecting mask 113, the checking circuit 130 repeats the right shift of the error-injecting bit 114, until the error-injecting bit 114 is shifted and traverse all of bits in the error-injecting mask 113 (i.e., all of the bits in the error-injecting mask 113 are used as the error-injecting bit 114 at least once). If the error-injecting bit 114 reaches a boundary of the error-injecting mask 113 (e.g., a boundary on a right side of the $13^{th}$ bit) during shifting, the error-injecting bit 114 is moved from a boundary on the other side of the error-injecting mask 113 (e.g., a boundary on a left side of the $1^{st}$ bit) to the error-injecting mask 113, so that the error-injecting bit 114 forms a cyclic shift in the error-injecting mask 113.

Figures 5C, 5D:
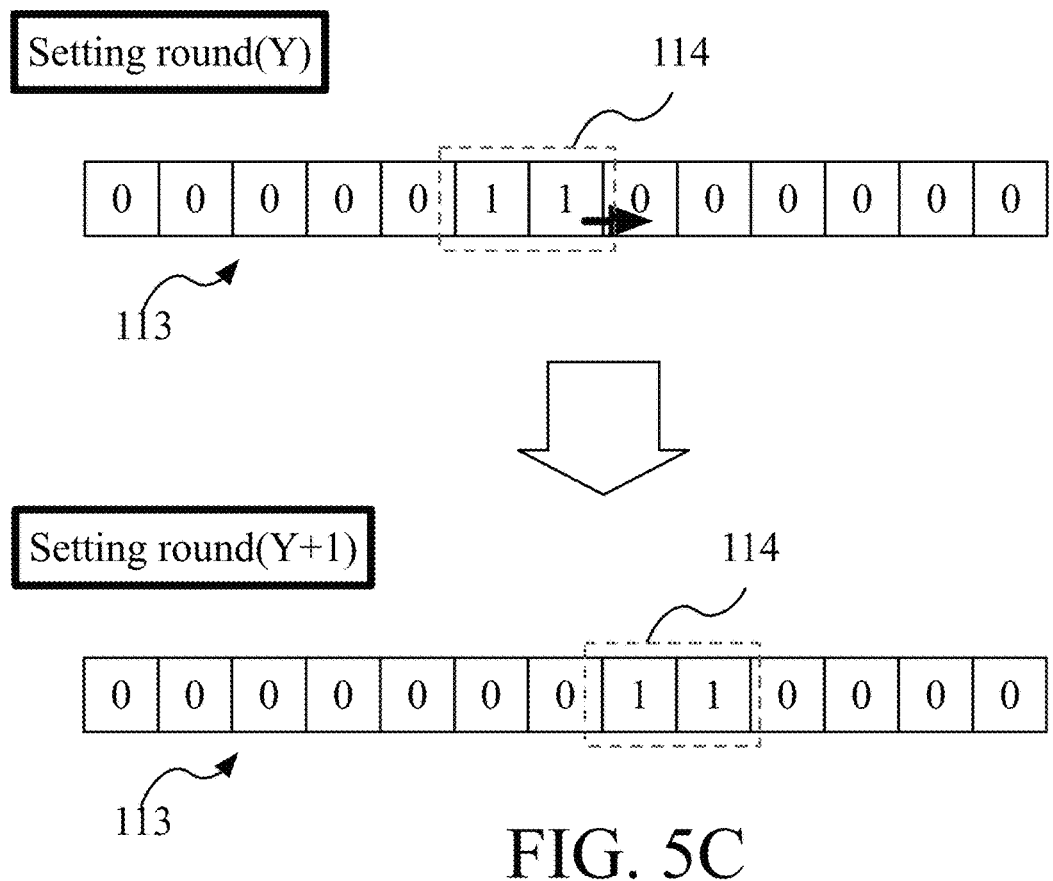
FIG. 5C is a schematic diagram of a plurality of error-injecting bits and shift processing in different setting rounds according to an embodiment.
FIG. 5D is a schematic flowchart of selecting an error-injecting bit at a new address according to an embodiment.

Similarly, the left shift is performed for the error-injecting bit 114 in the same way, and details are not described again. In some embodiments, for a plurality of error-injecting bits 114, the shifting method is based on a principle of not repeating the bit position. In other words, the positions of the error-injecting bits 114 in the setting round (Y) and the setting round (Y+1) may not repeat, as shown in FIG. 5C, where Y represents a number of rounds of the setting round. The checking circuit 130 may not only use the error-injecting mask 113 itself as the second data, but also may perform an exclusive-OR operation on the error-injecting mask 113 and other data in order to obtain the second data. For the convenience of description, the error-injecting mask 113 is directly used as the second data below.

In some embodiments, the checking circuit 130 may also select the position of the new the error-injecting bit 114 to obtain the second data in the following manner, as shown in FIG. 5D. According to some embodiments, the process of selecting the error-injecting bit 114 at a new position includes the following steps:

Step S521: other bits in the error-injecting mask that have not been selected is randomly selected by the checking circuit in order to obtain at least one new error-injecting bit; and Step S522: the random selection of the error-injecting bit is repeated, until all of specific positions in the error-injecting mask have been selected as the error-injecting bit for at least once.

The checking circuit 130 selects the error-injecting bit 114 from the error-injecting mask 113 through an algorithm of random selection. The checking circuit 130 randomly selects a bit that has not been used as the error-injecting bit 114 from the error-injecting mask 113. The checking circuit 130 may randomly select any bit from the remaining bits as a new position of the error-injecting bit 114 when the setting round is ended. When a next setting round starts, the checking circuit 130 use a new error-injecting bit 114 for verification. When the specific positions in the error-injecting mask 113 are all of the positions in the error-injecting mask 113, the checking circuit 130 records the error-injecting bit 114 and the position that are set in each setting round, until all of the bits in the error-injecting mask 113 have been selected as the error-injecting bit 114 for at least once. Alternatively, the checking circuit 130 may randomly select a new error-injecting bit 114 from the remaining bits at the beginning of a new setting round.

Figure 6A:
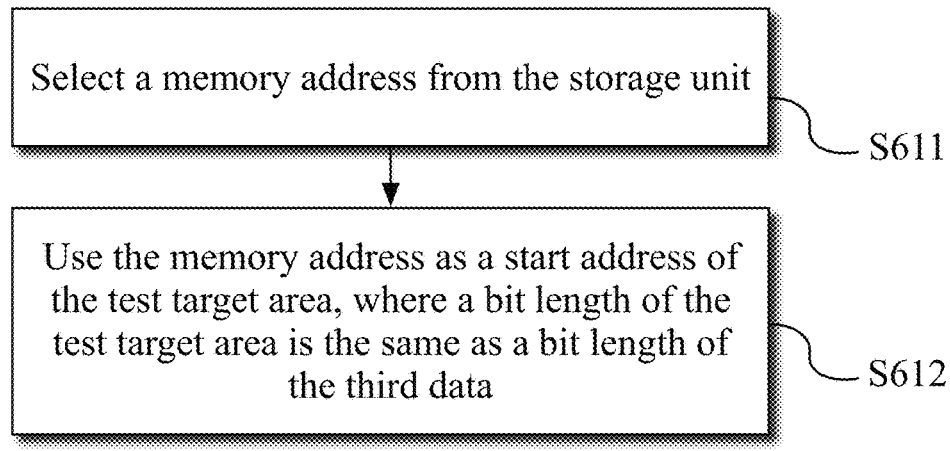
FIG. 6A is a schematic flowchart of selecting a test target area according to an embodiment.
Figure 6B:
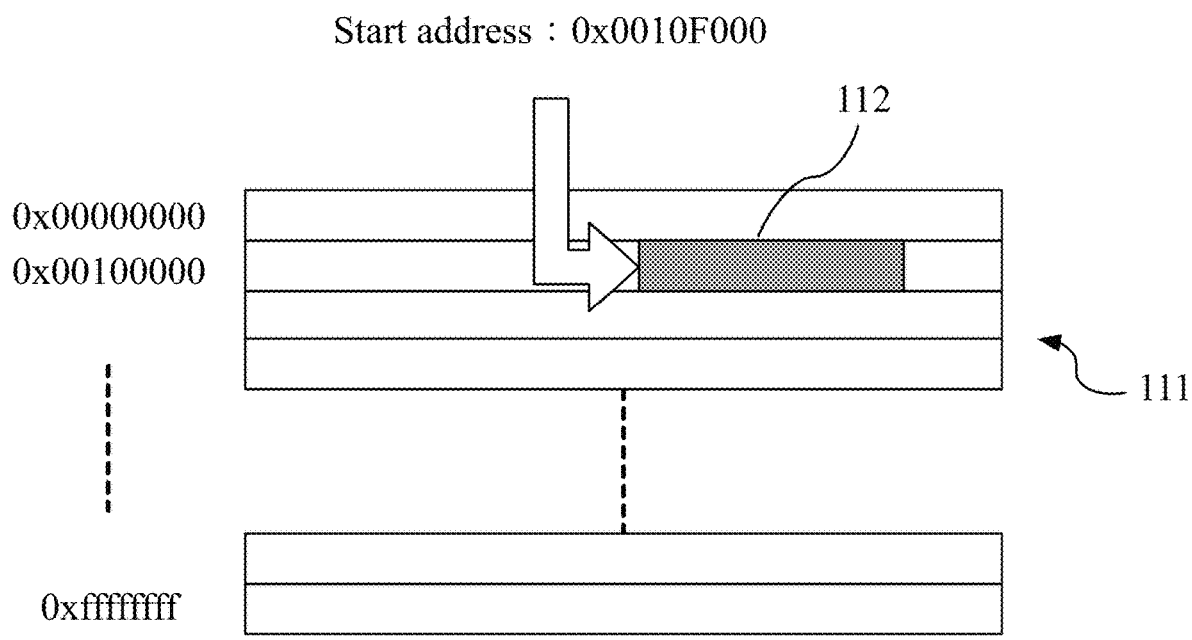
FIG. 6B is a schematic diagram of the test target area and a start address according to an embodiment.

In some embodiments, the checking circuit 130 may select the test target area 112 in the storage unit 110 in the following manner. FIG. 6A is a schematic flowchart of selecting a test target area according to an embodiment, and FIG. 6B is a schematic diagram of a test target area and a start address. According to an embodiment, the process of selecting the test target area 112 includes the following steps:

Step S611: a memory address is selected from the storage unit; and

Step S612: the memory address is used as a start address of the test target area, where a bit length of the test target area is identical to a bit length of the third data.

The checking circuit 130 selects any memory address from the storage unit 110 through random selection, and obtains the test target area 112 according to the bit length of the error-injecting mask 113 and the selected memory address. In FIG. 6B, a dark gray block shows the test target area 112, and the arrow indicates a start address of the memory address of the test target area 112. The checking circuit 130 performs related verification processing on the ECC circuit 120 in the test target area 112. For example, if the error-injecting mask 113 has a length of 13 bits, when the checking circuit 130 selects the memory position of "0X0010F000", a range of the test target area 112 is "0X0010F000" to "0X0010F00D".

Figure 6C:
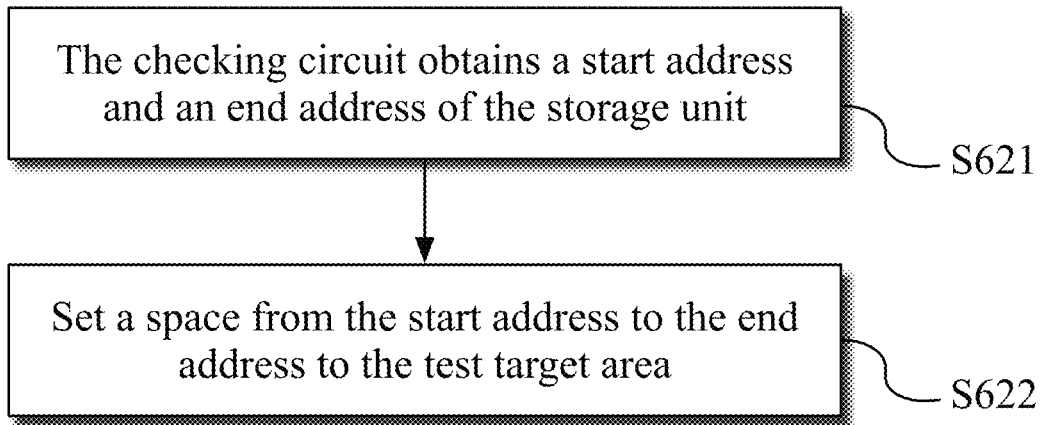
FIG. 6C is a schematic flowchart of selecting the test target area according to an embodiment.

In some embodiments, the checking circuit 130 may select the test target area 112 of different ranges. FIG. 6C is a schematic flowchart of selecting the test target area according to this embodiment. According to an embodiment, the process of selecting the test target area 112 includes the following steps:

Step S621: a start address and an end address of the storage unit is obtained by the checking circuit; and Step S622: a space from the start address to the end address is set to be the test target area.

The checking circuit 130 selects the start address and the end address from the storage unit 110, and uses a memory section between the start address and the end address as the test target area 112. A length of the test target area 112 is corresponding to the bit length of the error-injecting mask 113. In other words, the length of the test target area 112 is greater than the bit length of the error-injecting mask 113. The checking circuit 130 may set the test target area 112 as an entire memory space 111 of the storage unit 110 under test.

In some embodiments, the third data is written into a position in the test target area 112. After the checking circuit 130 determines the range of the test target area 112, the checking circuit 130 selects an address section 115 from the test target area 112. A bit length of the address section 115 is equivalent to the operation bit length (also identical to the length of the third data). The checking circuit 130 writes the third data into the selected address section 115, so that the third data is used as the fourth data.

In some embodiments, the checking circuit 130 may select the address sections 115 at different positions in different operation rounds. The operation round is a process in which the checking circuit 130 verifies each of the address sections 115. In another operation round of the checking circuit 130, the checking circuit 130 selects the address section 115 at another position from the test target area 112. The checking circuit 130 select another address section 115 at other positions by turns (may not in a specific order) from the test target area 112, until all the specific positions (e.g., all of positions) of the test target area 112 have been written.

Figure 7A:
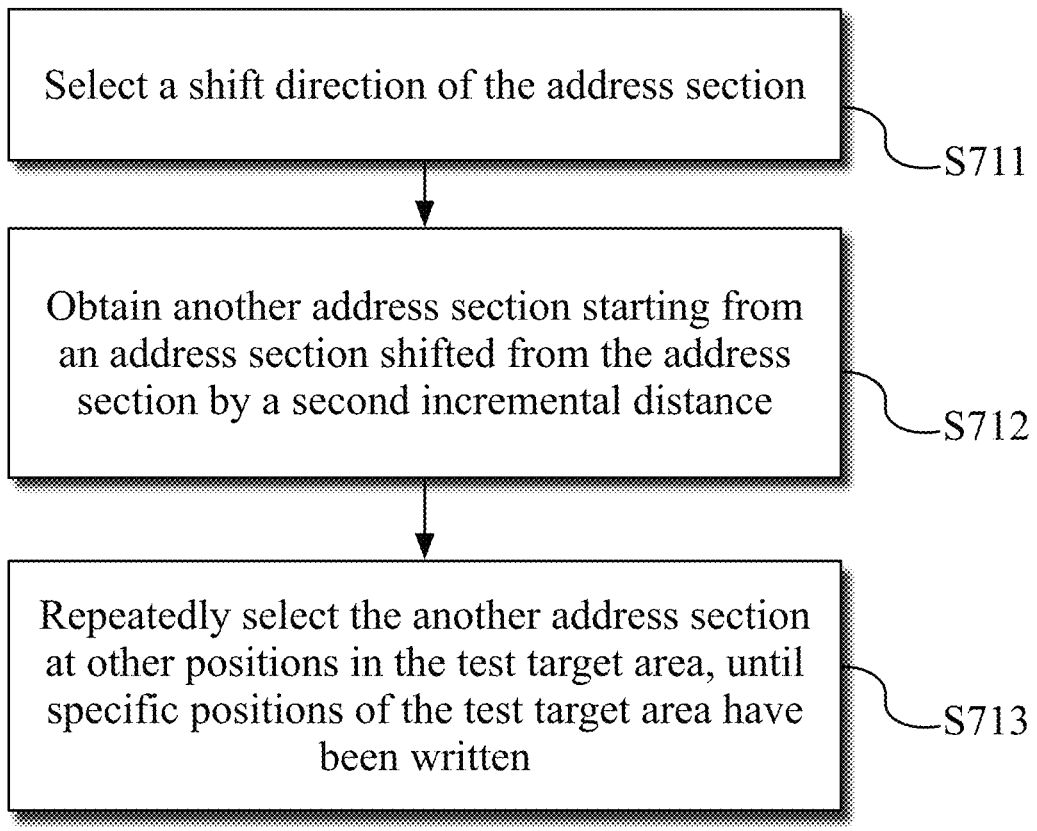
FIG. 7A is a schematic flowchart of selecting an address section according to an embodiment.

In some embodiments, the checking circuit 130 may select the address section 115 from the test target area 112 in the following manner, as shown in FIG. 7A. FIG. 7A is a schematic flowchart of selecting an address section according to an embodiment. According to an embodiment, the process of selecting the address section 115 includes the following steps:

Step S711: a shift direction of the address section is selected;

Step S712: another address section is obtained, wherein the another address section starts from an address section shifted from the address section by a second incremental distance; and Step S713: the another address section at other positions in the test target area is selected repeatedly, until specific positions of the test target area have been written.

The checking circuit 130 selects the shift direction of the address section 115, and the shift direction includes a left shift or a right shift. Before the operation round is ended, the checking circuit 130 obtains another address section 115, which is shifted from the current address section by the second incremental distance along the shift direction. The second incremental distance is determined by the bit length of the address section 115, so that the address sections 115 in these two rounds do not overlap. At the beginning of the next operation round, the checking circuit 130 performs a writing process of a new operation round according to the new address section 115.

Figure 7B:
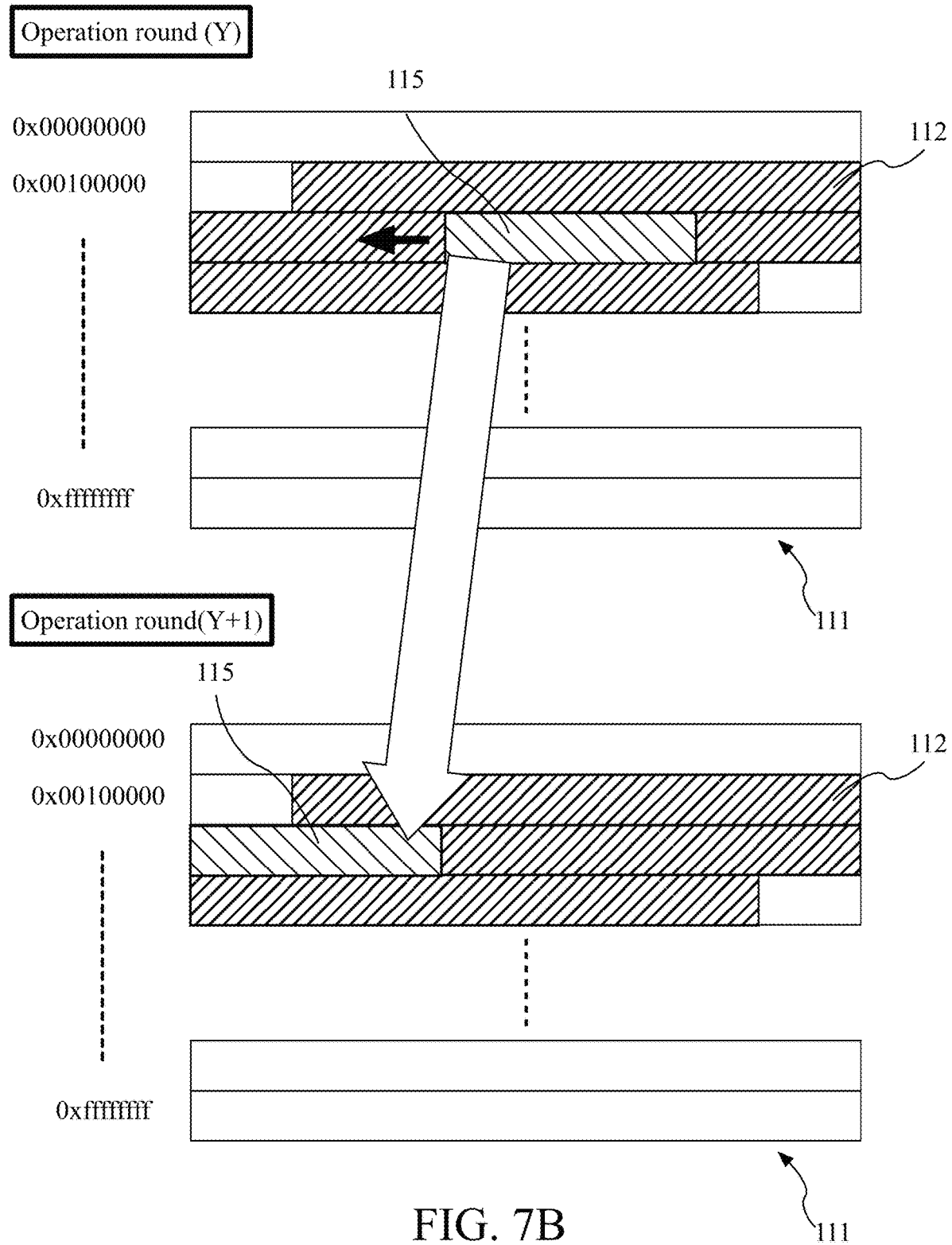
FIG. 7B is a schematic diagram of address sections in different operation rounds according to an embodiment.

Referring to FIG. 7B, an upper part of FIG. 7B represents an operation round (Y), and a lower part of FIG. 7B represents an operation round (Y+1), which are used for indicating the current and next operation rounds. The test target area 112 is a block with hatch patterns directing from upper left to lower right, and the address section 115 is a block with hatch patterns directing from upper right to lower left. A direction of a black solid arrow indicates the shift direction. If the checking circuit 130 selects the left shift, the second incremental distance is 1 operation bit length. In the operation round (Y+1), the checking circuit 130 moves the address section 115 to the left, as indicated by the white arrow in FIG. 7B. The checking circuit 130 repeatedly shifts the address section 115, until all of the positions in the test target area 112 are traversed.

In some embodiments, the checking circuit 130 selects a new address section 115 through random selection. Basically, the checking circuit 130 selects the new address section 115 from the test target area 112 and the memory position that has not been selected. After each operation round, the checking circuit 130 records the selected address section 115. The checking circuit 130 repeats the random selection of the address section 115, until all the positions of the test target area 112 are traversed.

The checking circuit 130 can form a nested loop through different operation rounds and setting rounds. The checking circuit 130 can perform bit verification on the test target area 112 and the address section 115. Referring to FIGS. 8A-8F, FIGS. 8A-8F show the memory space 111 of an SRAM. The test target area 112 is, for example, a block with hatch patterns directing from the upper left to the lower right and the address section 115 is, for example, a block with hatch patterns directing from the upper right to the lower left and a block with reticulated patterns represents the error-injecting bit 114. Generally, a value written into the address section 115 is the third data but not the error-injecting mask 113 itself. However, in order to clearly illustrate the operation sequence, the value of the error-injecting mask 113 including the error-injecting bit 114 is used as the third data for description.

Figure 8A:
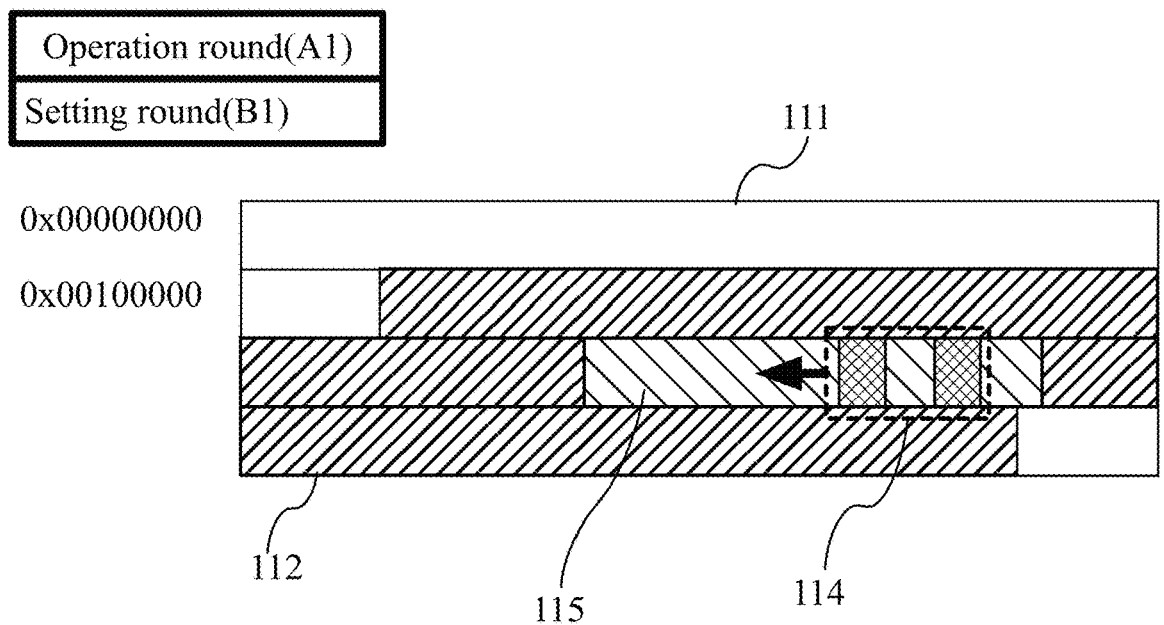
FIG. 8A is a schematic diagram of tan address section and an error-injecting bit in an operation round and a setting round according to an embodiment.

A number of current rounds of the operation round (A) and the setting round (B) of the checking circuit 130 is recorded in an upper table of FIG. 8A. In order to clearly describe the operations of the operation rounds and the setting rounds, the following defines Ax as the operation round, x as the number of rounds of the operation round, By as the setting round, and y as the number of rounds of the setting round. For example, in FIG. 8A, the checking circuit 130 checks the operation round (A1) and the setting round (B1). In addition, in order to simplify the description, the rounds (Ax, By) described below represent the general term of the corresponding operation round and the setting round.

In the setting round (B1), an initial position of the error-injecting bit 114 is a little endian area of the address section 115, and the two error-injecting bits 114 are spaced apart by one bit. The black arrow in FIG. 8A indicates the left shift direction of the error-injecting bit 114, and the first incremental distance is 1 bit. In other words, the error-injecting bit 114 moves from the little endian area to a big endian area. The checking circuit 130 outputs the verification result corresponding to the round (A1, B1) in the setting round (B1).

Figure 8B:
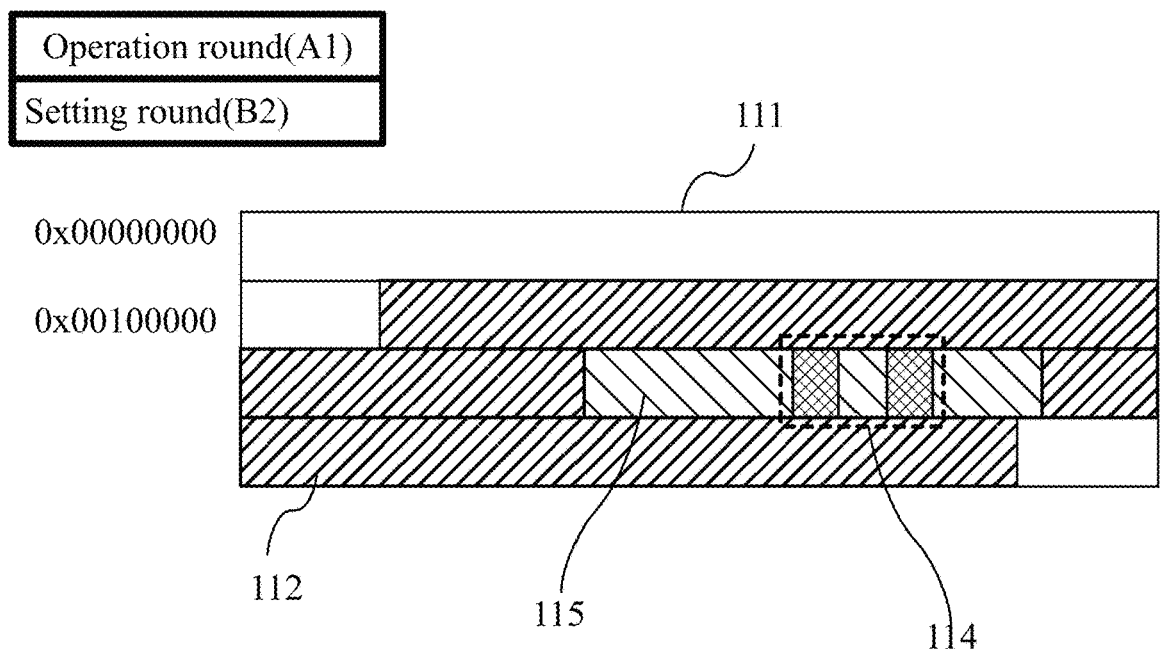
FIG. 8B is a schematic diagram of the address section and the error-injecting bit in the operation round and another setting round according to an embodiment.
Figure 8C:
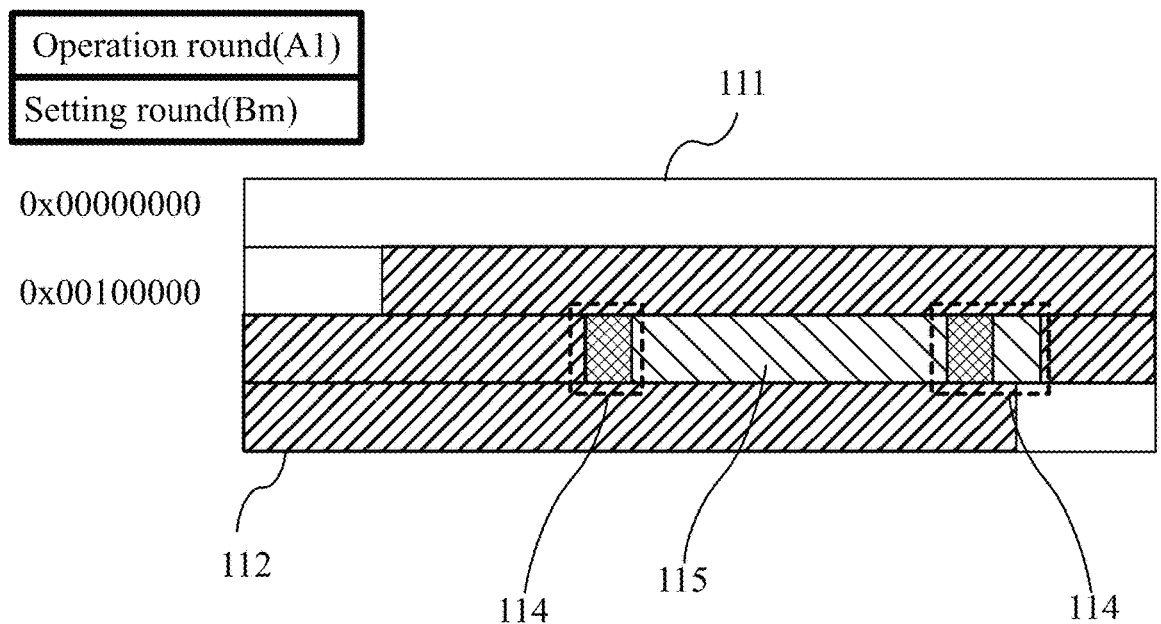
FIG. 8C is a schematic diagram of the address section and the error-injecting bit in the operation round and another setting round according to an embodiment.

FIG. 8B shows a new position of the error-injecting bit 114 in the address section 115 in the setting round (B2). The checking circuit 130 outputs the verification result corresponding to the round (A1, B2) in the setting round (B2). The checking circuit 130 repeats the shifting and setting of the error-injecting bit 114 in the address section 115, and obtains the verification result of each setting round (By). It is assumed that a total number of rounds in the setting round By is m, and a total number of rounds in the operation round Ay is n. After the checking circuit 130 experiences the setting round for m times in FIG. 8C, the error-injecting bit 114 traverse all of the positions in the address section 115.

Figure 8D:
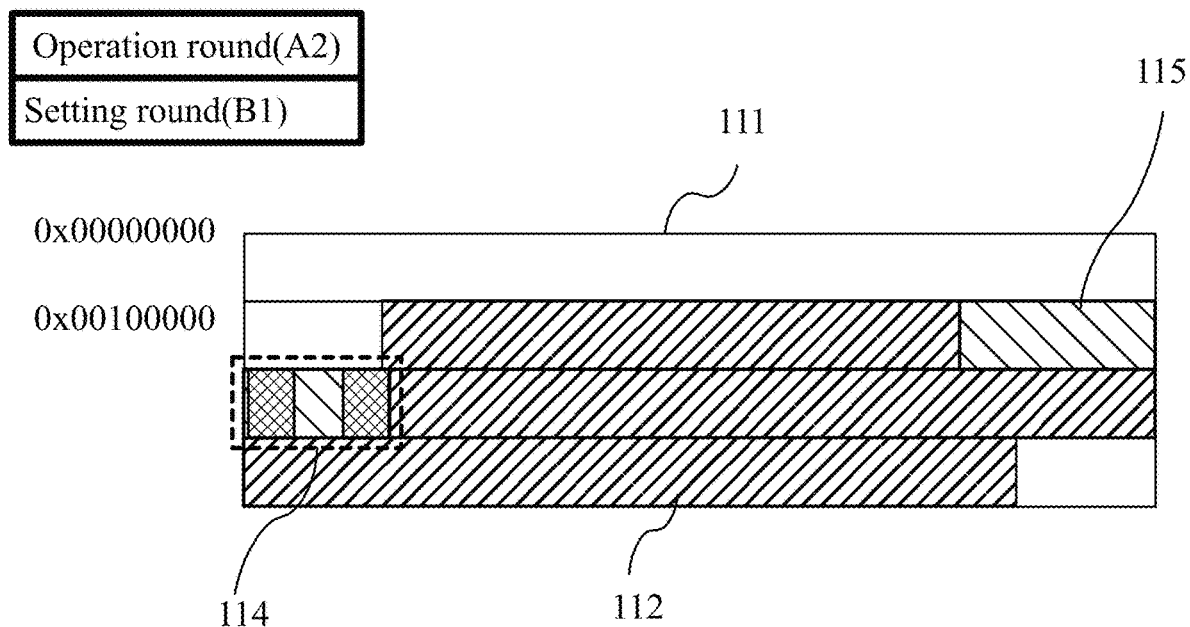
FIG. 8D is a schematic diagram of the address section and the error-injecting bit in another operation round and the setting round according to an embodiment.
Figure 8E:
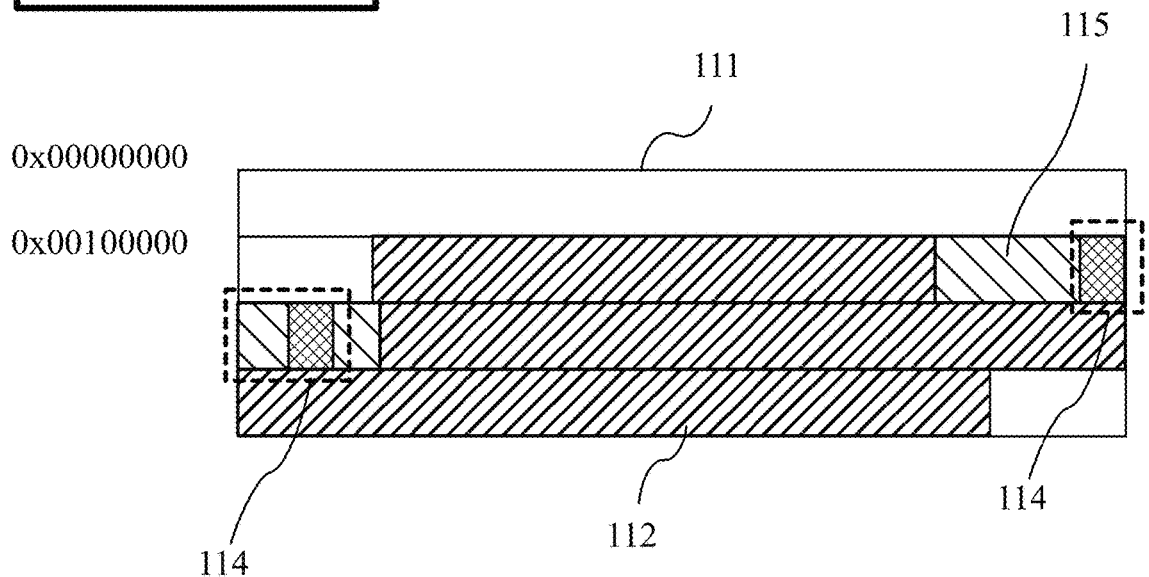
FIG. 8E is a schematic diagram of an address section and an error-injecting bit in another operation round and another setting round according to an embodiment.

FIG. 8D and FIG. 8E are respectively schematic diagrams showing positions of different error-injecting bits 114 of the address section 115 in the operation round (A2). In the round (A2, B1), the address section 115 is shifted to the left by one operation bit length (i.e., the second incremental distance), and the error-injecting bit 114 is to be set in the little endian area of the address section 115. In the round (A2, B2), the error-injecting bit 114 is shifted to the left by the first incremental distance, as shown in FIG. 8E. The checking circuit 130 repeats the shift processing of the error-injecting bit 114 until, all of the bits in the address section 115 are traversed, and the address section 115 is shifted to the next position. After the round (A2, Bm) is ended, the checking circuit 130 shifts the address section 115 to the left to the next position.

Figure 8F:
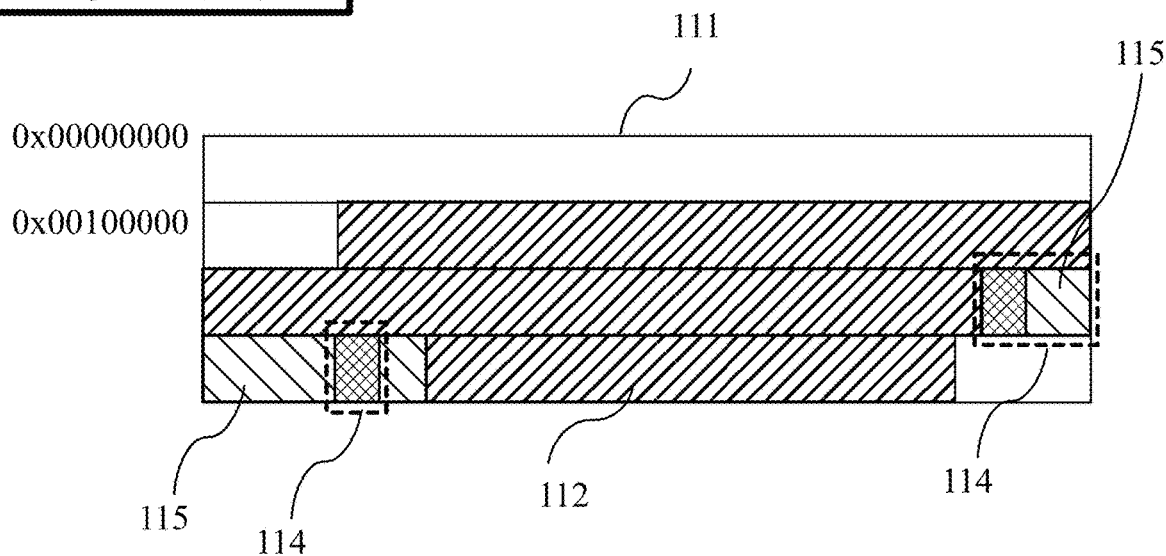
FIG. 8F is a schematic diagram of the address section and the error-injecting bit in still another operation round and still another setting round according to an embodiment.

FIG. 8F is a schematic diagram of the positions of the address section 115 and the error-injecting bit 114 in the operation round (An) and the setting round (Bm). The checking circuit 130 can obtain the verification result of each bit in the test target area 112 and the ECC circuit 120 upon completion of the operation round (An) and the setting round (Bm) (a number of the rounds is m*n). Therefore, the checking circuit 130 may confirm, according to the verification result, a position of the bit error of the SRAM and whether the ECC circuit 120 can operate correctly.

According to the processing method for verifying an SRAM and an ECC error of the present invention, the SRAM can check bit errors of specified area or all of the areas of the SRAM, and also can confirm whether the correction of the ECC circuit operates correctly. Since the checking can be performed synchronously and in batches according to the processing method for verifying an SRAM and an ECC error of the present invention, compared with the conventional time-sharing check, the present invention can save checking time and save costs for disposing hardware.

What is claimed is:

1. A verifying method for an error checking and correcting (ECC) circuit of a static random-access memory (SRAM), comprising:
inputting original data into an error-correcting-and-coding procedure to output first data;
obtaining second data according to an error-injecting mask;
performing a bit operation on the first data and the second data to obtain third data;
writing the third data into a test target area in the SRAM to be fourth data;
reading the fourth data from the test target area;
inputting the fourth data into an error-correcting-and-decoding procedure to output fifth data and an error message; and
obtaining a verification result according to the fifth data, the original data, the error message, and the second data.

2. The verifying method for an ECC circuit of an SRAM according to claim 1, wherein the step of inputting the original data into the error-correcting-and-coding procedure to output the first data comprises: adjusting the original data having an original bit length to the first data having an operation bit length.

3. The verifying method for an ECC circuit of an SRAM according to claim 2, wherein the step of obtaining the second data according to the error-injecting mask comprises:
setting a bit length of the error-injecting mask according to the operation bit length;
selecting at least one error-injecting bit from the error-injecting mask; and
writing error-injecting data into the at least one error-injecting bit to obtain the second data.

4. The verifying method for an ECC circuit of an SRAM according to claim 3, wherein the step of obtaining the second data according to the error-injecting mask further comprises:
repeatedly selecting other bits from the error-injecting mask to be the at least one error-injecting bit, until all of bits of the error-injecting mask have been selected.

5. The verifying method for an ECC circuit of an SRAM according to claim 4, wherein the step of repeatedly selecting the other bits from the error-injecting mask to be the at least one error-injecting bit comprises:
obtaining the other bits of the error-injecting mask by repeatedly shifting a first incremental distance from the selected at least one error-injecting bit.

6. The verifying method for an ECC circuit of an SRAM according to claim 4, wherein the step of repeatedly selecting the other bits from the error-injecting mask to be the at least one error-injecting bit comprises:
randomly selecting the other bits in the error-injecting mask that have not been selected to obtain at least one new error-injecting bit.

7. The verifying method for an ECC circuit of an SRAM according to claim 3 wherein the step of writing the third data into the test target area in the SRAM to be the fourth data comprises:
selecting a memory address from the SRAM; and
using the memory address as a start address of the test target area, wherein a bit length of the test target area is identical to a bit length of the third data.

8. The verifying method for an ECC circuit of an SRAM according to claim 7, wherein the step of writing the third data into the test target area in the SRAM to be the fourth data further comprises:
selecting an address section from the test target area, wherein a bit length of the address section is identical to the bit length of the third data; and writing the third data into the address section to be the fourth data.

9. The verifying method for an ECC circuit of an SRAM according to claim 3 wherein the step of writing the third data into the test target area in the SRAM to be the fourth data further comprises:
obtaining a start address and an end address of the SRAM; and
defining a space from the start address to the end address to be the test target area, wherein a bit length of the test target area is greater than or equal to a bit length of the third data.

10. The verifying method for an ECC circuit of an SRAM according to claim 9, wherein the step of writing the third data into the test target area in the SRAM to be the fourth data further comprises:
selecting an address section from the test target area, wherein a bit length of the address section is identical to the bit length of the third data; and
writing the third data into the address section as the fourth data.

11. The verifying method for an ECC circuit of an SRAM according to claim 8, wherein the step of writing the third data into the test target area in the SRAM to be the fourth data further comprises:
repeatedly selecting another address section at other positions from the test target area, until all of the address section of the test target area have been selected.

12. The verifying method for an ECC circuit of an SRAM according to claim 11, wherein the step of repeatedly selecting the another address section at the other positions from the test target area comprises:
obtaining the another address section starting from an address section shifted from the address section by a second incremental distance.

13. The verifying method for an ECC circuit of an SRAM according to claim 11, wherein the step of repeatedly selecting the another address section at the other positions from the test target area comprises:
randomly selecting other addresses in the test target area that have not been selected to obtain the another address section.

14. The verifying method for an ECC circuit of an SRAM according to claim 1, wherein the bit operation is selected from an OR operation or an exclusive-OR operation.

* * * * *